(12) United States Patent
Tomioka et al.

(10) Patent No.: US 8,031,469 B2
(45) Date of Patent: Oct. 4, 2011

(54) ELECTRONIC DEVICE

(75) Inventors: Kentaro Tomioka, Sayama (JP); Takeshi Hongo, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/787,305

(22) Filed: May 25, 2010

(65) Prior Publication Data
US 2011/0075362 A1 Mar. 31, 2011

(30) Foreign Application Priority Data
Sep. 30, 2009 (JP) ................................ 2009-228133

(51) Int. Cl.
*H05K 7/20* (2006.01)
*F28D 15/00* (2006.01)

(52) U.S. Cl. .................... 361/700; 165/104.33; 361/694; 361/695

(58) Field of Classification Search .................... 361/700
See application file for complete search history.

(56) References Cited

U.S. PATENT DOCUMENTS

| | | | |
|---|---|---|---|
| 4,399,819 A * | 8/1983 | Cowdery | 607/9 |
| 5,365,749 A * | 11/1994 | Porter | 62/259.2 |
| 5,402,312 A * | 3/1995 | Kinjo et al. | 361/695 |
| 5,930,112 A * | 7/1999 | Babinski et al. | 361/695 |
| 6,014,313 A * | 1/2000 | Hesselbom | 361/704 |
| 6,101,095 A * | 8/2000 | Yamaguchi | 361/720 |
| 6,501,662 B2 * | 12/2002 | Ikeda | 361/760 |
| 7,327,569 B2 * | 2/2008 | Belady et al. | 361/699 |
| 7,710,725 B2 * | 5/2010 | Takakusaki et al. | 361/700 |
| 2003/0063444 A1 * | 4/2003 | Kalkbrenner | 361/752 |
| 2006/0227507 A1 * | 10/2006 | Jeong | 361/700 |
| 2008/0151502 A1 * | 6/2008 | Shives et al. | 361/704 |

FOREIGN PATENT DOCUMENTS

| | | |
|---|---|---|
| JP | U58-27895 A | 8/1981 |
| JP | U 58-27895 A | 8/1981 |
| JP | U 06-50355 | 7/1994 |
| JP | 07-176660 A | 7/1995 |
| JP | 10-092990 A | 4/1998 |
| JP | 2001-127476 A | 5/2001 |
| JP | 2001-332868 A | 11/2001 |
| JP | 2005-114789 A | 4/2005 |
| JP | 2009-150561 A | 7/2009 |

OTHER PUBLICATIONS

Notice of Reasons for Rejection mailed by Japan Patent Office on Aug. 3, 2010 in the corresponding Japanese patent application No. 2009-228133.
Notice of Reasons for Rejection mailed by Japan Patent Office on Oct. 26, 2010 in the corresponding Japanese patent application No. 2009-228133.
Information Sheet for preparing an Information Disclosure Statement under Rule 1.56.
Translation of Reference for JP U58-27895 A.

* cited by examiner

*Primary Examiner* — Gregory Thompson
(74) *Attorney, Agent, or Firm* — Knobbe, Martens, Olson & Bear LLP

(57) ABSTRACT

According to one embodiment, the electronic device includes a housing, the first to third printed circuit boards, and a fan unit. The first printed circuit board includes the first heat-generating part secured to the first wiring board. The second printed circuit board includes the second and third heat-generating parts, has an amount of heat generation larger than that of the first printed circuit board, and is located between the first printed circuit board and the second wall. The third printed circuit board includes the fourth heat-generating part, has an amount of heat generation smaller than that of the first printed circuit board, and is located between the first printed circuit board and the first wall.

7 Claims, 7 Drawing Sheets

ELECTRONIC DEVICE

CROSS-REFERENCE TO RELATED APPLICATIONS

This application is based upon and claims the benefit of priority from Japanese Patent Application No. 2009-228133, filed Sep. 30, 2009, the entire contents of which are incorporated herein by reference.

BACKGROUND

1. Field

One embodiment of the present invention relates to an electronic device comprising a plurality of printed wiring boards.

2. Description of the Related Art

Jpn. Pat. Appln. KOKAI Publication No. 2001-332868 discloses an electronic device comprising a plurality of printed wiring boards arranged inside its cover. This electronic device includes a base member formed into a plate-like shape by an aluminum die-casting, and first to third printed circuit boards mounted on one surface of the base member. On the first printed circuit board, heavy-weight and large-size electronic parts such as a capacitor and an electromagnetic coil are placed. On the second printed circuit board, heat-generating parts such as bear-chip parts of a power transistor are mounted. Further, on the third printed circuit board, small-size electronic parts are mounted.

For adhering the second printed circuit board and the base member together, a high heat-conductive silicon adhesive is used, with which the heat generated from the heat-generating parts is easily released to the base member.

In the electronic device having the above-described structure, the heat generated from the second printed circuit board diffuses to the surroundings via the base member. However, to the base member, the first printed circuit board and the third printed circuit board are adhered, and therefore the heat generated from the second printed circuit board is propagated to the first printed circuit board and the third printed circuit board, thereby causing a thermally adverse effect on these members.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, the electronic device includes a housing, the first to third printed circuit boards, and a fan unit to release the heat generated from the first to third printed circuit boards to the outside of the housing. The first printed circuit board includes the first printed wiring board and the first heat-generating part secured to the wiring board. The second printed circuit board includes the second printed wiring board, and the second and third heat-generating parts, has an amount of heat generation larger than that of the first printed circuit board, and is located between the first printed circuit board and the second wall. The third printed circuit board includes the third printed wiring board and the fourth heat-generating part, has an amount of heat generation smaller than that of the first printed circuit board, and is located between the first printed circuit board and the first wall.

Embodiments of the television attachment device, which is an example of the electronic device of the present invention, will now be described with reference to FIGS. 1 to 7. The television attachment device is used as it is connected to a low-profile television or the like, and the device has, for example, a function of receiving various types of television programs, or recording a plurality of television programs at the same time, or recording a long-term program. With the television attachment device, terrestrial digital broadcasting, BS digital broadcasting and CS digital broadcasting can be received, and programs of these broadcasting systems can be recorded.

In this specification, the near side to the user (that is, user side) is defined as front, the far side from the user is rear, the left-hand side of the user is left, the right-hand side of the user is right, the upper side from the user's position is up and the lower side from the user's position is down.

Figure 1:
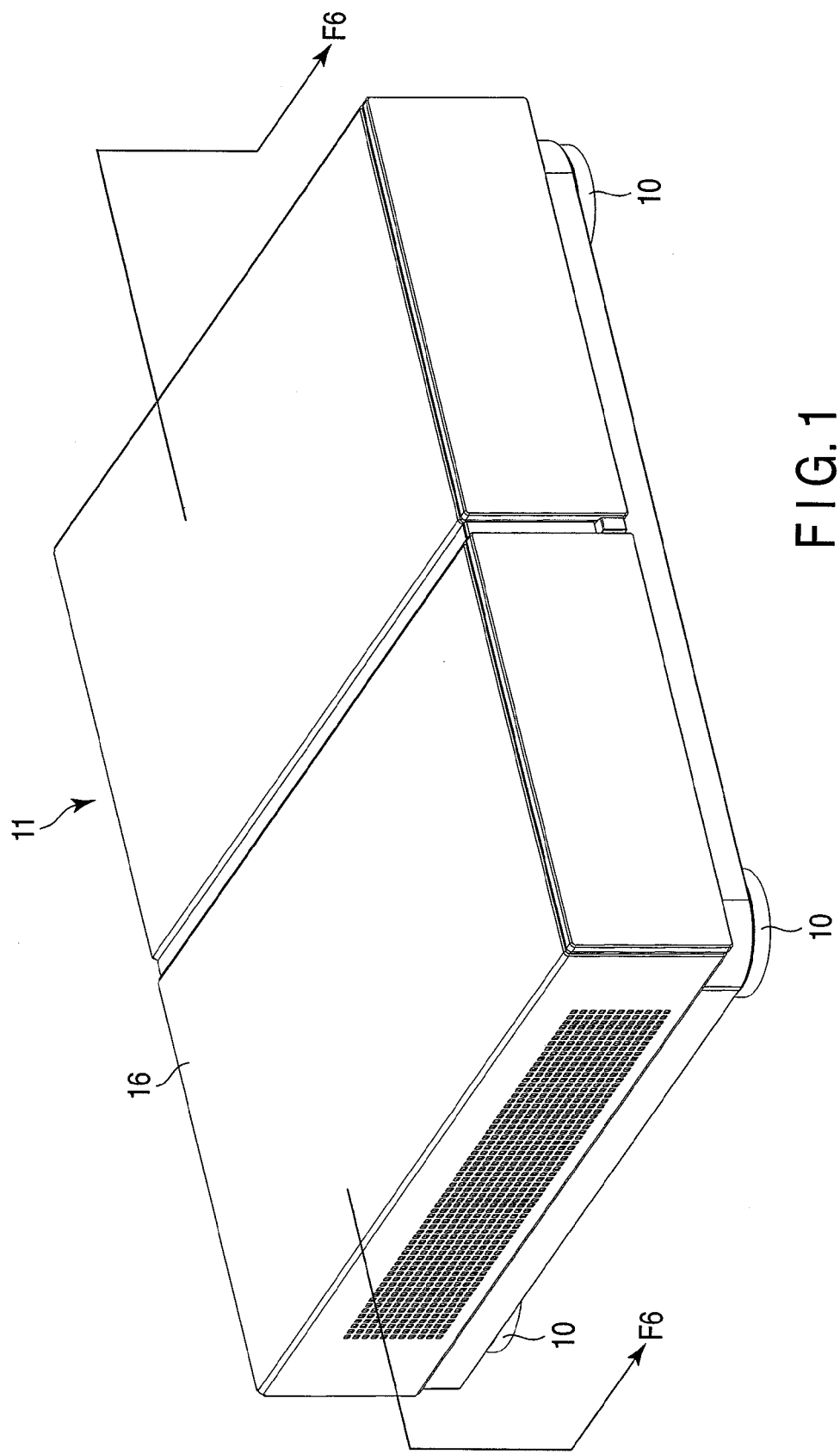
FIG. 1 is an exemplary perspective view of a television attachment device, which is an example of the electronic device according to the first embodiment.
Figure 3:
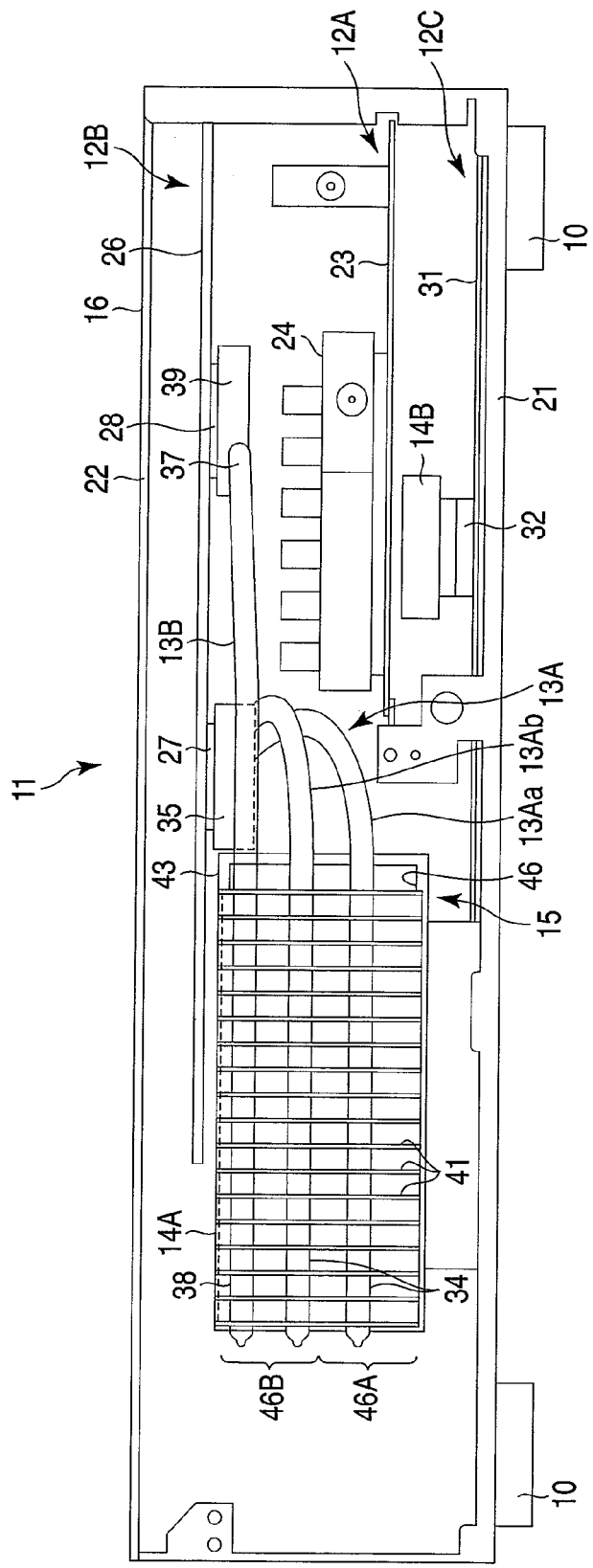
FIG. 3 is an exemplary rear view of an inside of the television attachment device shown in FIG. 1 viewed from back.
Figure 6:
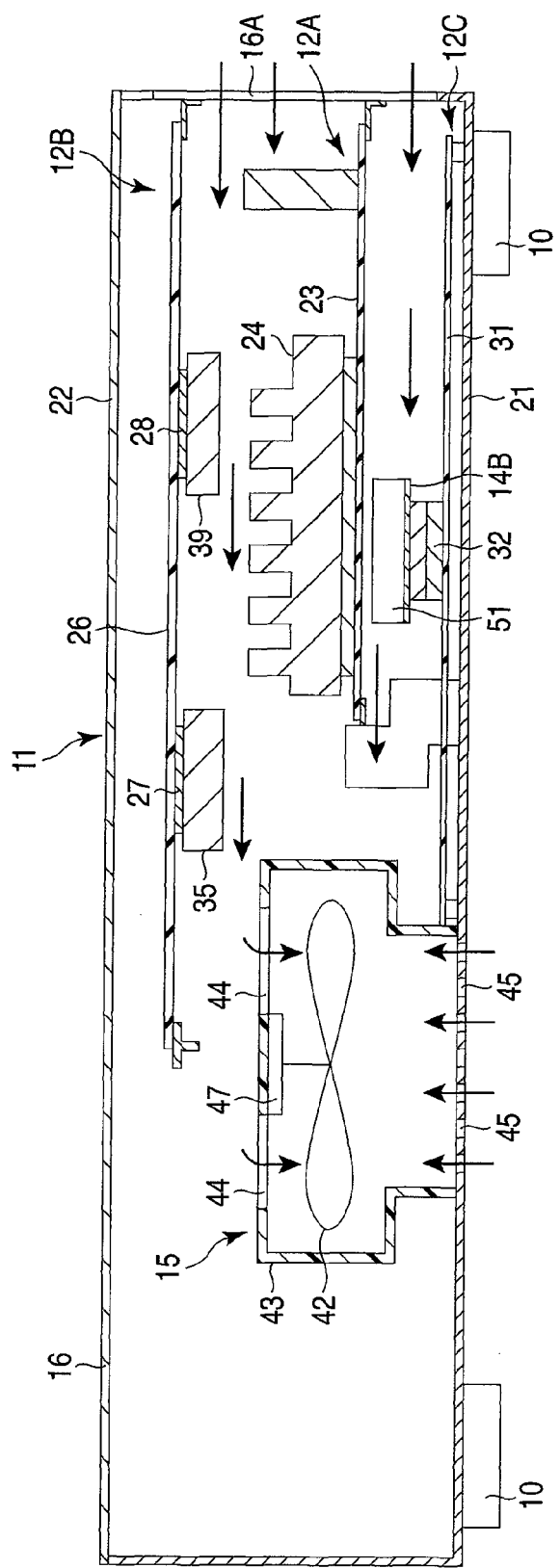
FIG. 6 is an exemplary cross section of the television attachment device taken along the line F6-F6 in FIG. 1.

As shown in FIG. 1, a television attachment device 11 includes a housing 16 which is a box-shaped enclosure of the device. As shown in FIGS. 1, 3 and 6, the housing 16 comprises a first wall 21 including a support portion 10 and a second wall 22 which opposes the first wall 21.

Figure 2:
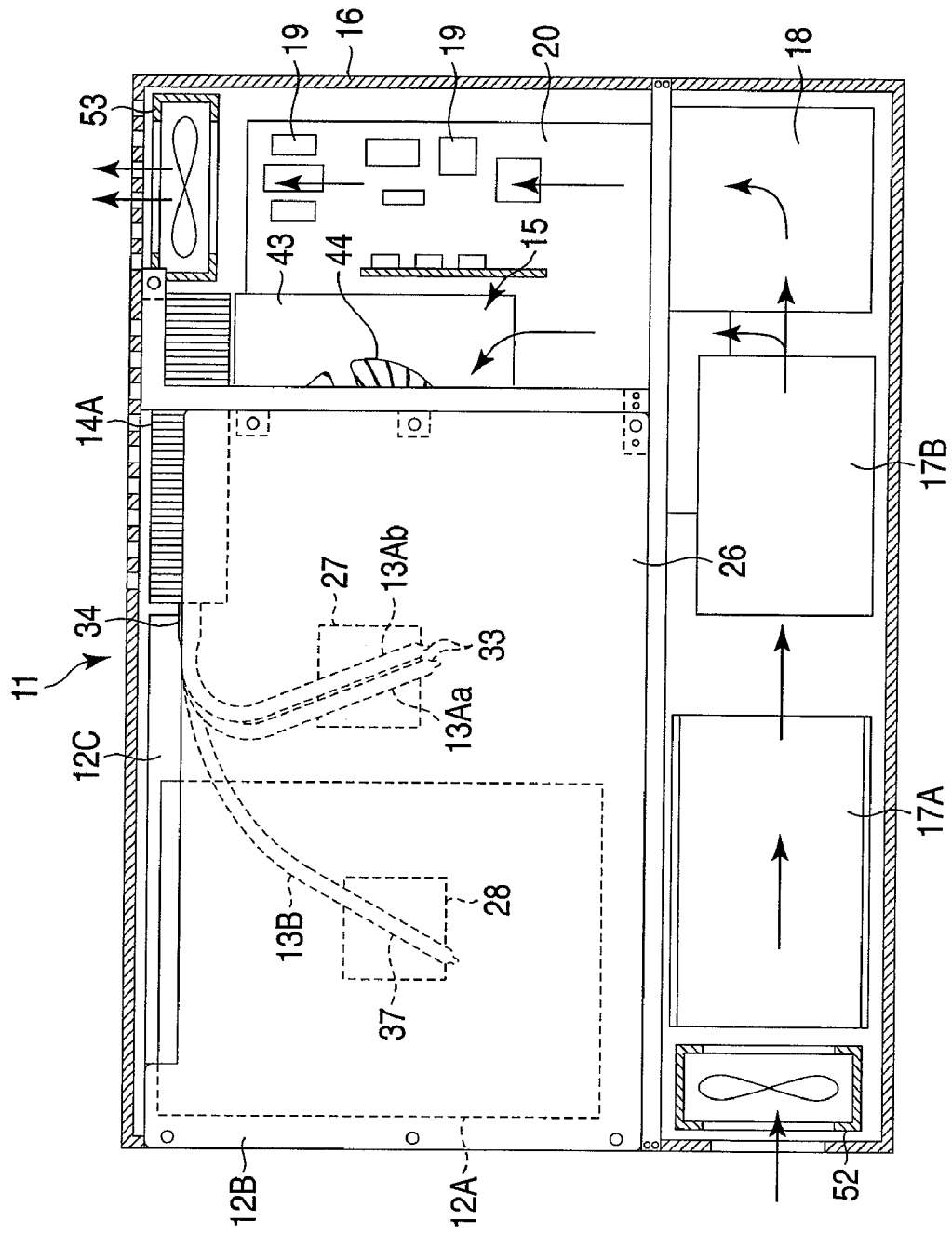
FIG. 2 is an exemplary cross section of the television attachment device taken along the horizontal direction in FIG. 1.

As shown in FIGS. 2 and 3, the television attachment device 11 comprises first to third printed circuit boards 12A to 12C, first and second heat pipes 13A and 13B, first and second heat sinks 14A and 14B and a fan unit 15 for cooling the first to third printed circuit boards 12A to 12C within the inside of the housing 16. Further, the television attachment device 11 comprises first and second auxiliary fan units 53, first and second hard disk drive devices 17A and 17B, which are memory devices for storing images, a card holder 18 to which a card for authentication can be inserted and a power circuit board 20 on which a plurality of power circuit parts 19 are mounted, within the inside of the housing 16.

The first printed circuit board 12A is the so-called tuner substrate, and it includes the first printed wiring board 23 and the first heat-generating part 24 secured on one surface (upper surface) of the first printed wiring board 23. In this embodiment, the first heat-generating part 24 comprises, for example, a tuner. The amount of heat generated from the entire first printed circuit board 12A is, for example, about 15 to 20 W. As shown in FIGS. 2 and 3, the first printed circuit board 12A is placed at a position which overlays on the second heat pipe 13B but displaces from the first heat pipe 13A as viewed from the above.

The second printed circuit board 12B is provided at a position above the first printed circuit board 12A and between the first printed circuit board 12A and the second wall 22. The second printed circuit board 12B is the so-called main substrate (cell substrate), and it supervises the control of each of the parts of the television attachment device 11. The second printed circuit board 12B is placed to oppose the first printed circuit board 12A with a gap between itself and the first printed circuit board 12A. As shown in FIGS. 2 and 3, the second printed circuit board 12B is placed such as to overlay on a portion of the fan unit 15 from above.

Figure 5:
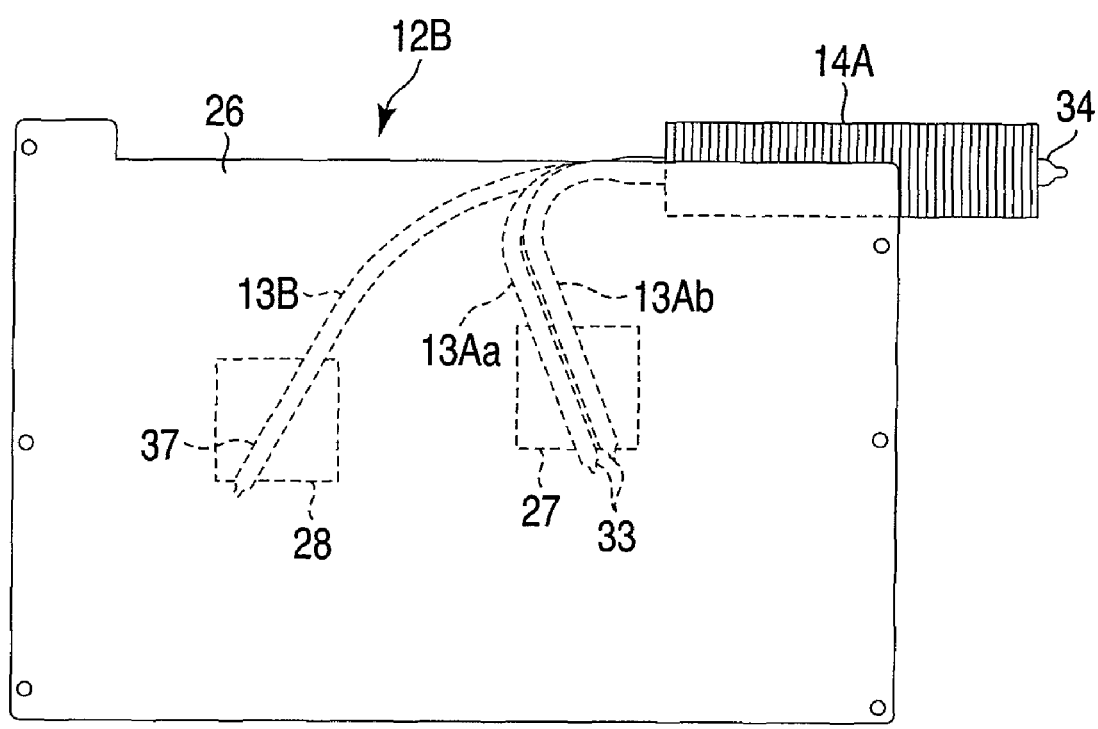
FIG. 5 is an exemplary top view of the second printed circuit board of the television attachment device shown in FIG. 1.

As shown in FIGS. 2, 3 and 5, the second printed circuit board 12B comprises the second printed wiring board 26, the second and third heat-generating parts 27 and 28 secured on one surface (lower surface) of the second printed wiring board 26, and other heat-generating parts. The second printed circuit board 12B is formed larger than the first printed circuit board 12A and the third printed circuit board 12C. The second printed circuit board 12B is provided to cover over the above of the first printed circuit board 12A and the third printed circuit board 12C in a manner of a lid. With this configuration, the heat generated from the first to third printed circuit boards 12A to 12C are directed to the fan unit 15 positively.

The second heat-generating part 27 comprises, for example, circuit parts called cell processors. The amount of heat generated from the second heat-generating part 27 is, for example, about 50 W. As shown in FIG. 3, the second heat-generating part 27 is placed at a position which displaces from the first heat-generating part 24.

The third heat-generating part 28 comprises, for example, circuit parts such as I/O controllers. The amount of heat generated from the third heat-generating part 28 is, for example, about 15 W. As shown in FIG. 3, the third heat-generating part 28 is placed at a position which overlays on the first heat-generating part 24. The other heat-generating parts include circuit parts such as RAMS. Therefore, the amount of heat generated from the entire second printed circuit board 12B is, for example, about 50 to 100 W, and it is larger than that of the first printed circuit board 12A.

As shown in FIGS. 2 and 3, the third printed circuit board 12C is provided at a position below the first printed circuit board 12A and between the first printed circuit board 12A and the first wall 21. The third printed circuit board 12C is the so-called image processing substrate. The third printed circuit board 12C is placed to oppose the first printed circuit board 12A with a gap between itself and the first printed circuit board 12A. The third printed circuit board 12C comprises the third printed wiring board 31 and the fourth heat-generating part 32 secured on one surface (upper surface) of the third printed circuit board 12C. The fourth heat-generating part 32 comprises, for example, circuit parts for image processing. The amount of heat generated from the entire third printed circuit board 12C is, for example, about 1 to 10 W, and it is smaller than that of the first printed circuit board 12A. Therefore, the three printed circuit boards 12A to 12C are arranged from the upper side in decreasing order of the amount of heat generated.

As shown in FIGS. 2, 3 and 5, the first heat pipe 13A is used for cooling down the second heat-generating part 27. The first heat pipe 13A comprises two members each formed into a rod shape having an outer diameter of 8 mm. The first heat pipe 13A is formed by sealing a working fluid such as water inside a hollow rod-like main body made of, for example, copper. Each of the two members (13Aa and 13Ab) of the first heat pipe 13A includes a first end portion 33 thermally connected to the second heat-generating part 27 and a second end portion 34 provided on an opposite side to the first end portion 33. The first end portion 33 is thermally connected to the second heat-generating part 27 via a first heat receiving plate 35. The second end portion 34 is provided in the vicinity of the fan unit 15.

More specifically, the second end portion 34 of one first heat pipe member 13Aa faces a lower half portion 46A of an exhaustion outlet portion 46 of the fan unit 15, which will be later explained. Further, the second end portion 34 of the other first heat pipe member 13Ab faces an upper half portion 46B of the exhaustion outlet portion 46 of the fan unit 15, which will be later explained.

It should be noted that the two members of the first heat pipe member 13A are arranged such that the level of the heat-receiving portion is located higher than the level of the heat-releasing portion, which is the so-called top heat state. However, the two members of the first heat pipe member 13A employs heat pipes capable of dealing with the top heat, and therefore no such a situation that their cooling performance is not exhibited do not occur. To be more specific, for a wick provided on an inner circumferential surface of the first heat pipe 13A, a porous layer is used, which is formed by sintering copper powder into a layer having a uniform thickness.

The second heat pipe 13B is used for cooling down the third heat-generating part 28. The second heat pipe 13B is formed by sealing a working fluid such as water inside a hollow rod-like main body made of, for example, copper. The second heat pipe 13B includes a third end portion 37 thermally connected to the third heat-generating part 28 and a fourth end portion 38 provided on an opposite side to the third end portion 37. The third end portion 37 is thermally connected to the second heat-generating part 27 via a second heat receiving plate 39. The fourth end portion 38 is provided to face an upper half portion 46B of the exhaustion outlet portion 46 of the fan unit 15. It should be noted that in the second heat pipe 13B, the level of the heat-receiving portion is located to be substantially equal to the level of the heat-releasing portion, and therefore the top heat state is not created. With this arrangement, the wick used for the second heat pipe 13B comprises a plurality of narrow grooves formed in an inner circumferential surface of the second heat pipe 13B.

Further, in this embodiment, the fourth end portion 38 is located at a level higher than that of the exhaustion outlet portion 46; however the present invention is not limited to this configuration. It is alternatively possible that the exhaustion outlet portion 46 is made to have such a large size that the fourth end portion 38 faces straightforward to the exhaustion outlet portion 46.

Further, as shown in FIG. 2, the distance between the fan unit 15 and the second heat-generating part 27 is set shorter than the distance between the fan unit 15 and the third heat-generating part 28. With this arrangement, the length of the first heat pipe 13A is shorter than that of the second heat pipe 13B.

As shown in FIGS. 2 and 3, the first heat sink 14A is connected to the second end portion 34 of the first heat pipe 13A and the fourth end portion 38 of the second heat pipe 13B such a to promote the release of heat from the first heat pipe 13A and the second heat pipe 13B. The first heat sink 14A is located at a position which faces the exhaustion outlet portion 46 of the fan unit 15, which will be later explained. The first heat sink 14A includes a plurality of fins 41A connected to the second end portion 34 and the fourth end portion 38.

Figure 4:
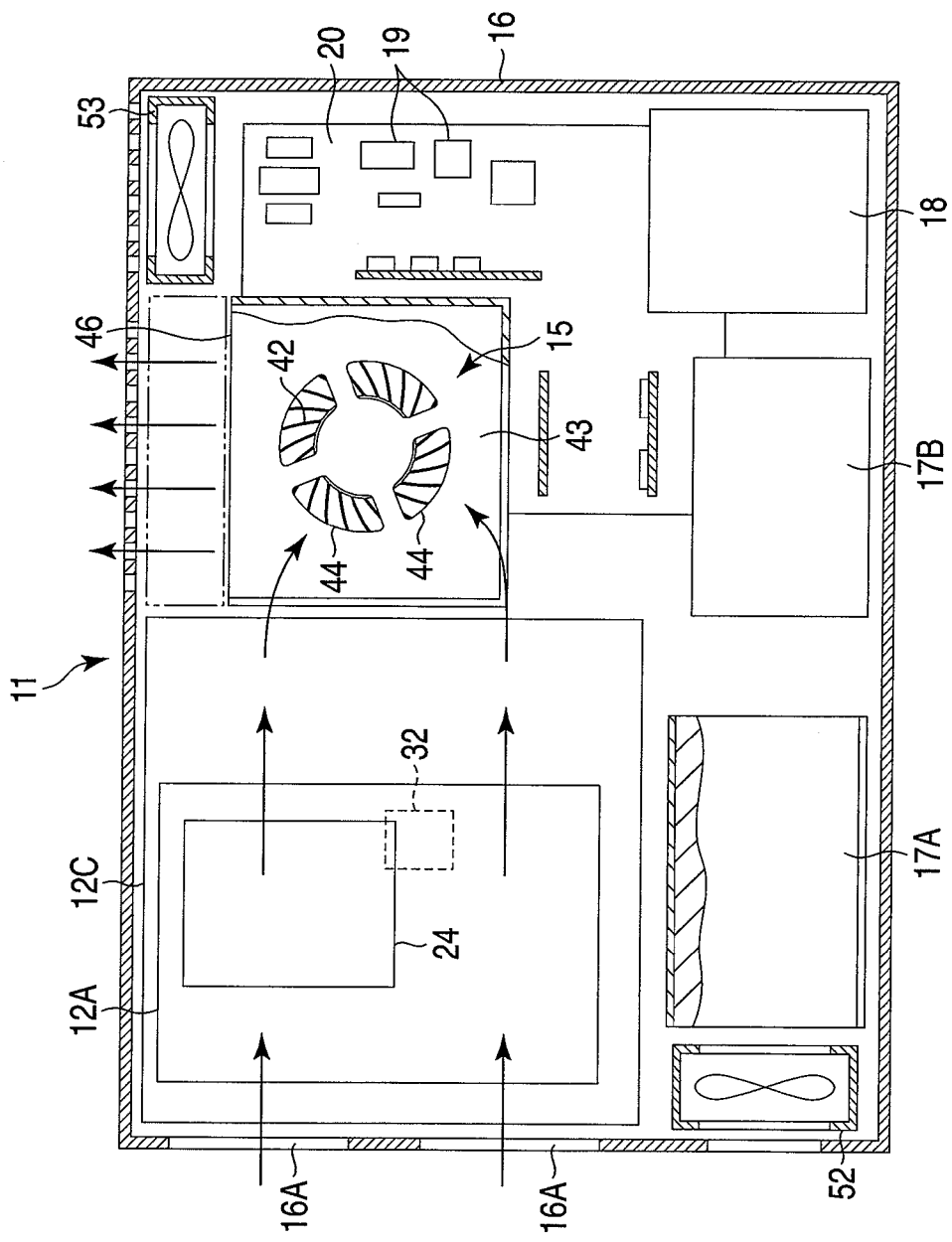
FIG. 4 is exemplary another cross section of the television attachment device taken along the horizontal direction in FIG. 1 but in a different level from that of the cross section shown in FIG. 2.

The fan unit 15 is located at a position lower than the second printed circuit board 12B. The fan unit 15 is able to release the heat generated from the first to third printed circuit boards 12A to 12C to the outside of the housing 16. As shown in FIGS. 4 and 6, the fan unit 15 comprises a fan main body 42, a box-shaped fan case 43 which enclose the fan main body 42 and a motor 47 which drives the rotation of the fan main body 42. The fan case 43 comprises a first suction opening portion 44 formed in an upper section of the case, a second suction opening portion 45 formed in a lower section thereof and an exhaustion opening portion 46 formed in a lateral section thereof.

The first suction opening portion 44 connects the inside of the housing 16 and the inside of the fan case 43 to communicate to each other, and the second suction opening portion 45 connects the outside of the housing 16 and the inside of the fan case 43 to communicate to each other. The first fan unit 15 is able to suction air from the inside of the housing 16 via the first suction opening portion 44. Similarly, the first fan unit 15 is able to suction air from the outside of the housing 16 via the second suction opening portion 45. Further, the first fan unit 15 is able to direct the air blown from the fan main body 42 towards the first heat sink 14A and the outside of the housing 16 via the exhaustion opening portion 46.

Figure 7:
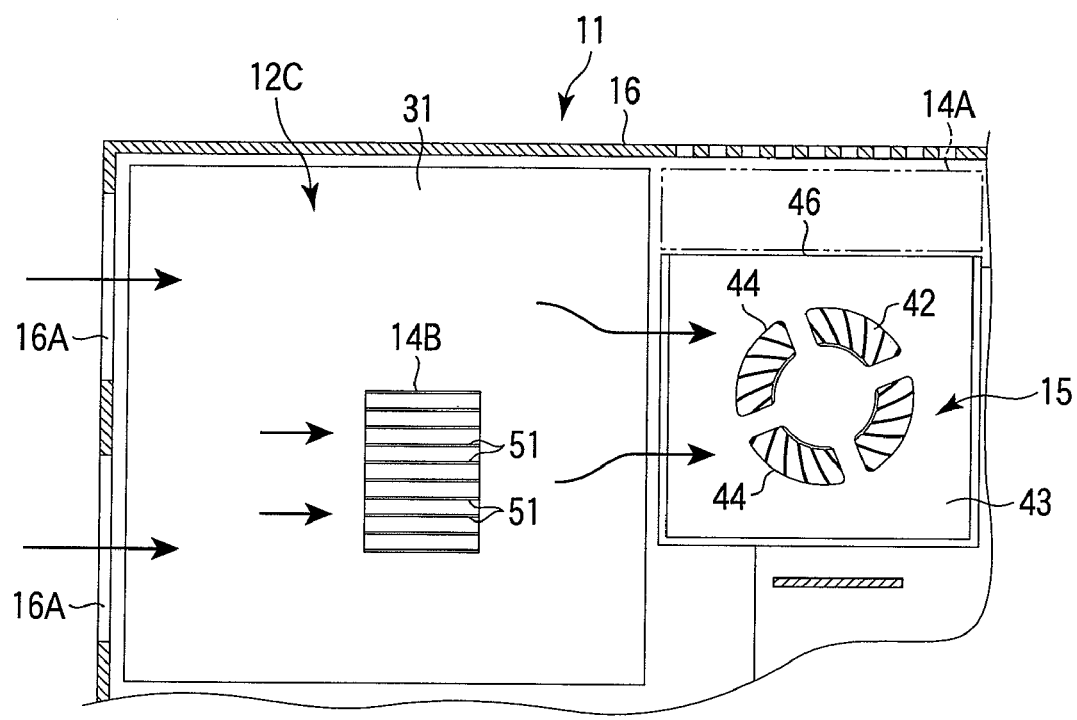
FIG. 7 is exemplary another cross section of the television attachment device taken along the horizontal direction in FIG. 1 but in a different level from that of the cross section shown in FIG. 2.

As shown in FIGS. 6 and 7, the second heat sink 14B is thermally connected to the fourth heat-generating part 32. The second heat sink 14B comprises a plurality of heat-radiating fins 51 which is set straight upwards. The heat-radiating fins 51 are arranged in a direction along the line connecting an opening portion 16A for suctioning air in the housing 16 and the fan unit 15. With this arrangement, the fourth heat-generating part 32 can be cooled down smoothly without disturbing the flow of the air directed from the opening portion 16A towards the fan unit 15.

Here, the operation of cooling down the first and second hard disk drive devices 17A and 17B and the operation of cooling down the first to fourth heat-generating parts 24, 27, 28 and 32 will now be described. As shown in FIG. 2, the first hard disk drive device 17A and the second hard disk drive device 17B are cooled down with the air suction from the outside of the housing 16 by the first auxiliary fan unit 52. The air used to cool down the first hard disk drive device 17A and the second hard disk drive device 17B is used also to cool down the power circuit part 19. After used to cool down the power circuit part 19, the air is discharged to the outside of the housing 16 via the exhaust opening portion 46.

As shown in FIG. 6, the heat generated from the first heat-generating part 24 is propagated to the air flowing the surroundings thereof, and then the air is sent towards the fan unit 15. The air sent to the fan unit 15 is discharged to the outside of the housing 16 via the exhaust opening portion 46.

As shown in FIG. 3, the heat generated by the second heat-generating part 27 is conveyed to the second end portion 34 and the first heat sink 14A via the first heat receiving plate 35 and the two members of the first heat pipe 13A. Here, the second end portion 34 of one member of the first heat pipe 13A is located to face the lower half portion 46A of the exhaustion outlet portion 46 of the fan unit 15. To the lower half portion 46A of the exhaustion outlet portion 46, mainly, the air suctioned from the outside of the housing 16 via the second suction opening portion 45 is sent. In this manner, low-temperature air is sent to the second end portion 34 of the one member of the first heat pipe 13Aa, and thus the second heat-generating part 27 is cooled down with priority as compared to the other heat-generating parts. Meanwhile, the second end portion 34 of the other member of the first heat pipe 13Ab is located to face the upper half portion 46B of the exhaustion outlet portion 46 of the fan unit 15. With this arrangement, the second heat-generating part 27 is cooled down further by the other member of the first heat pipe 13A. Thus, the cooling down of the second heat-generating part 27 can be further promoted.

The heat generated by the third heat-generating part 28 is conveyed to the fourth end portion 38 and the first heat sink 14A via the second heat receiving plate 39 and the second heat pipe 13B. Here, the heat conveyed to the fourth end portion 38 and the first heat sink 14A is propagated to the air sent from the fan unit 15, which is then discharged to the outside of the housing 16.

As shown in FIGS. 6 and 7, the heat generated by the fourth heat-generating part 32 is conveyed to the second heat sink 14B. The heat conveyed to the second heat sink 14B is propagated to the air suctioned from the opening portion 16A of the housing 16, which is sent to the exhaustion outlet portion 46 of the fan unit 15 and then discharged to the outside of the housing 16. The amount of heat generated from the fourth heat-generating part 32 is small, and therefore the fourth heat-generating part 32 can be cooled down sufficiently by the second heat sink 14B.

According to the first embodiment, the television attachment device 11 comprises: the housing 16 including the first wall 21 containing the support portion 10 and the second wall 22 opposing the first wall 21; the first printed circuit board 12A housed inside the housing 16 and including the first printed wiring board 23 and the first heat-generating part 24 secured to the wiring board 23; the second printed circuit board 12B housed inside the housing 16, including the second printed wiring board 26, and the second heat-generating part 27 and the third heat-generating part 28 secured to the wiring board 26, having an amount of heat generation larger than that of the first printed circuit board 12A, and opposing the first printed circuit board 12A with a gap between the first printed circuit board 12A and the second wall 22; the third printed circuit board 12C housed inside the housing 16, including the third printed wiring board 31 and the fourth heat-generating part 32 secured to the wiring board 31, having an amount of heat generation smaller than that of the first printed circuit board 12A, and opposing the first printed circuit board 12A with a gap between the first printed circuit board 12A and the first wall 21; and the fan unit 15 housed inside the housing 16, configured to release the heat generated from the first printed circuit board 12A, the second printed circuit board 12B and the third printed circuit board 12C to an outside of the housing 16.

With the above-described structure, the heat generated from the first to fourth heat-generating parts 24, 27, 28 and 32 can be released to the outside of the housing 16 by the fan unit 15. Further, the second printed circuit board 12B, which has the largest amount of heat generation, is located at the top, and therefore it is possible to prevent the heat generated from the second printed circuit board 12B from causing an adverse effect on the other printed circuit boards.

In this embodiment, the second heat-generating part 27 and the third heat-generating part 28 are secured to the lower surface of the second printed wiring board 26, and the second printed circuit board 12B is placed to overlay on the fan unit 15. With this configuration, the second printed wiring board 26 functions as a lid, and thus the heat generated from the second heat-generating part 27 and the third heat-generating part 28 can be released to the outside of the housing 16 efficiently by the fan unit 15 located underneath the second printed wiring board 26.

The television attachment device 11 of this embodiment comprises the first heat pipe member 13Aa including the first end portion 33 thermally connected to the second heat-generating part 27, and the second end portion 34 provided on an opposite side to the first end portion 33 and in the vicinity of the fan unit 15. The fan unit 15 includes the fan main body 42 and the fan case 43 which encloses the fan main body 42. The fan case 43 includes the first suction opening portion 44 formed in an upper section of the case, which connects the inside of the housing 16 and the inside of the fan case 43 to communicate to each other, the second suction opening portion 45 formed in a lower section thereof, which connects the outside of the housing 16 and the inside of the fan case 43 to communicate to each other, and the exhaustion opening portion 46 formed in a lateral section thereof, which sends the air blown from the fan main body 42 towards the outside of the housing 16. The amount of heat generated from the second heat-generating part 27 is larger than that of the third heat-generating part 28. The second end portion 34 is located to face the lower half portion 46A of the exhaustion opening portion 46.

With this structure, the air suctioned from the outside of the housing 16 via the second suction opening portion 45 is sent mainly to the lower half portion 46A of the exhaustion outlet portion 46. In this manner, the second end portion 34 of the first heat pipe member 13Aa, connected to the second heat-generating part 27, which has a large amount of heat generation, can be cooled down efficiently and thus the second heat-generating part 27 is cooled down with priority as compared to the other heat-generating parts.

Further, the television attachment device 11 comprises the second heat pipe 13B including the third end portion 37 thermally connected to the third heat-generating part 28, and the fourth end portion 38 provided on an opposite side to the third end portion 37 and in the vicinity of the exhaustion opening portion 46 of the fan unit 15. With this structure, the third heat-generating part 28 can be cooled down with the second heat pipe 13B. In this case, the fourth end portion 38 of the second heat pipe 13B is not located in the vicinity of the lower half portion 46A of the exhaustion opening portion 46 of the fan unit 15, and therefore the efficiency for cooling the third heat-generating part 28 is lower than the efficiency for cooling the second heat-generating part 27. Here, the amount of heat generated from the third heat-generating part 28 is smaller than the amount of heat generated from the second heat-generating part 27, and therefore even if the cooling efficiency is lower, it creates no substantial problem. Rather, by devising the layout of the first heat pipe 13A and the second heat pipe 13B, each of the heat-generating parts can be cooled down according to its priority.

It should be noted here that when the first heat pipe 13A connected to the second heat-generating part 27 of the second printed circuit board 12B located at the top is routed to the vicinity of the fan unit 15, which is located below the first printed circuit board 12A, more specifically, to the lower half portion 46A of the exhaustion opening portion 46, there may possibly raise a problem of the interference between the first printed circuit board 12A, which is located in the middle, and the first heat pipe 13A. In order to avoid this, the first printed circuit board 12A is placed at a position which overlays on the second heat pipe 13B and also displaces from the first heat pipe 13A. With this arrangement, it is possible to prevent the first heat pipe 13A and the first printed circuit board 12A from interfering with each other.

In general, as the length of a heat pipe is shorter, the heat conveying performance of the heat pipe is more enhanced. In this embodiment, the distance between the fan unit 15 and the second heat-generating part 27 is set shorter than the distance between the fan unit 15 and the third heat-generating part 28. With this arrangement, the length of the first heat pipe 13A can be made shorter than that of the second heat pipe 13B. In this manner, the amount of heat conveyed by the first heat pipe 13A can be increased, thereby making it possible to cool down the second heat-generating part 27 efficiently.

Further, the third heat-generating part 28 is placed at a position which overlays on the first heat-generating part 24, whereas the second heat-generating part 27 is placed at a position which displaces from the first heat-generating part 24. With this arrangement, the second heat-generating part 27, which has a large amount of heat generation, can be located at a position away from the first heat-generating part 24. In this manner, it is possible to prevent the heat from being concentrated at one place inside the housing 16.

Furthermore, the television attachment device 11 comprises the opening portion 16A formed in the housing 16 and able to suction air into the housing 16 from outside, and the second heat sink 14B which comprises a plurality of heat-radiating fins 51 which promote the cooling down of the fourth heat-generating part 32. The heat-radiating fins 51 are arranged in a direction along the line connecting the opening portion 16A and the fan unit 15. With this arrangement, the fourth heat-generating part 32 and the first and second heat pipes 13A and 13B can be cooled down smoothly without having the flow of the air directed from the opening portion 16A towards the fan unit 15 disturbed by the heat-radiating fins 51.

Apart from the above, the television attachment device of the present invention can be modified into various versions when it is carried out as long as the essence of the invention does not fall out of its scope.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
   a housing comprising a first wall comprising a support portion and a second wall facing the first wall;
   a first printed circuit board inside the housing and comprising a first heat-generating part;
   a second printed circuit board between the first printed circuit board and the second wall inside the housing and comprising a second heat-generating part and a third heat-generating part on a surface thereof on a side to the first wall, the second printed circuit board having an amount of heat generation larger than that of the first printed circuit board;
   a third printed circuit board between the first printed circuit board and the first wall inside the housing and comprising a fourth heat-generating part, the third printed circuit board having an amount of heat generation smaller than that of the first printed circuit board; and
   a fan unit comprising a fan case comprising a first suction opening portion connected to the inside of the housing on a side to the second wall, a second suction opening portion connected to the outside of the housing on a side to the first wall, and an exhaust opening portion in a lateral portion of the fan case, the fan case partially overlaying on the second printed circuit board on the side to the second wall.

2. The electronic device of claim 1, further comprising:
a first heat pipe comprising a first end portion thermally connected to the second heat-generating part, and a second end portion provided on an opposite side to the first end portion and in the vicinity of the fan unit,
wherein
the amount of heat from the second heat-generating part is larger than the amount of heat from the third heat-generating part, and
the second end portion is located to face a lower half portion of the exhaustion opening portion.

3. The electronic device of claim 2, further comprising:
a second heat pipe comprising a third end portion thermally connected to the third heat-generating part, and a fourth end portion on an opposite side to the third end portion and in the vicinity of the exhaustion opening portion of the fan unit.

4. The electronic device of claim 3, wherein the first printed circuit board is placed at a position which overlays on the second heat pipe and away from the first heat pipe.

5. The electronic device of claim 4, wherein a distance between the fan unit and the second heat-generating part is shorter than a distance between the fan unit and the third heat-generating part.

6. The electronic device of claim 5, wherein the third heat-generating part is placed at a position which overlays on the first heat-generating part, and the second heat-generating part is placed at a position away from the first heat-generating part.

7. The electronic device of claim 6, further comprising:
an opening portion in the housing and configured to suction air into the housing from outside; and
a heat sink comprising a plurality of heat-radiating fins configured to cool down the fourth heat-generating part,
wherein the plurality of heat-radiating fins are arranged in a direction along a line connecting the opening portion and the fan unit.

* * * * *